(12) United States Patent
Lee et al.

(10) Patent No.: US 8,860,008 B2
(45) Date of Patent: Oct. 14, 2014

(54) FORMING ACTIVE CHANNEL REGIONS USING ENHANCED DROP-CAST PRINTING

(75) Inventors: Seonghoon Lee, Seoul (KR); Jung-Pyo Hong, Seoul (KR)

(73) Assignee: SNU R&DB Foundation, Seoul (KR)

( * ) Notice: Subject to any disclaimer, the term of this patent is extended or adjusted under 35 U.S.C. 154(b) by 520 days.

(21) Appl. No.: 12/604,877

(22) Filed: Oct. 23, 2009

(65) Prior Publication Data

US 2010/0155710 A1     Jun. 24, 2010

(30) Foreign Application Priority Data

Dec. 24, 2008   (KR) .................. 10-2008-0133716

(51) Int. Cl.
*H01L 29/08*     (2006.01)

(52) U.S. Cl.
USPC .............. 257/40; 257/E51.001; 257/E51.003; 257/E51.005

(58) Field of Classification Search
CPC ............ H01L 51/0012; H01L 51/0003; H01L 51/0545
USPC ............. 257/40, E51.001, E51.003, E51.005; 438/99
See application file for complete search history.

(56) References Cited

U.S. PATENT DOCUMENTS

| | | | | |
|---|---|---|---|---|
| 5,539,219 A * | 7/1996 | den Boer et al. | ............... | 257/72 |
| 2006/0110847 A1* | 5/2006 | Fujimori et al. | ............... | 438/99 |
| 2008/0054257 A1* | 3/2008 | Tsai et al. | ............... | 257/40 |
| 2008/0070343 A1* | 3/2008 | Hahn et al. | ............... | 438/99 |
| 2008/0308793 A1* | 12/2008 | Jeong et al. | ............... | 257/40 |
| 2009/0297868 A1* | 12/2009 | Ito et al. | ............... | 428/447 |
| 2010/0308309 A1* | 12/2010 | Mannsfeld et al. | ............... | 257/40 |
| 2010/0323473 A1* | 12/2010 | Yamada et al. | ............... | 438/99 |
| 2011/0079775 A1* | 4/2011 | Zhu | ............... | 257/40 |

* cited by examiner

*Primary Examiner* — David Vu
(74) *Attorney, Agent, or Firm* — Patterson & Sheridan, LLP

(57) ABSTRACT

An active region or channel for printed, organic or plastic electronics or polymer semiconductors, such as organic field-effect transistors (OFETs), is obtained by using an enhanced inkjet drop-cast printing technique. A two-liquid system is employed to achieve the direct growth of well-oriented organic crystals at the active region of channel. High-performance electrical properties exhibiting high carrier mobility and low threshold voltage are obtained due to the proper orientation of molecules in the grown crystal in a highest mobility direction, due to the absence of grain boundaries, and due to low trap densities. The hydrophobic-hydrophilic interactions between the liquids utilized, which results in the fabrication of low-cost and mass-producible printable electronic devices for applications in flexible displays, electronic signages, photovoltaic panels, membrane keyboards, radio frequency identification tags (RFIDs), electronic sensors, and integrated electronic circuits.

20 Claims, 7 Drawing Sheets

FIG.10

Table 1

|  | $\mu_{FET}$ (cm$^2$V$^{-1}$s$^{-1}$) | $I_{on}/I_{off}$ | $V_{th}$ (V) |
|---|---|---|---|
| First Embodiment | 0.3 | 4 × 10$^8$ | -1.2 |
| Second Embodiment | 0.1 | 4 × 10$^5$ | -2.3 |

FORMING ACTIVE CHANNEL REGIONS USING ENHANCED DROP-CAST PRINTING

CROSS-REFERENCE TO RELATED APPLICATIONS

This disclosure claims priority benefit of Korean Patent Application No. 10-2008-0133716 filed on Dec. 24, 2008, the entire contents of which are hereby incorporated by reference.

BACKGROUND OF THE INVENTION

1. Field of the Invention

The features described herein relate to forming an active channel region using enhanced drop-cast printing techniques for printed electronics. The enhanced drop-cast printing method uses a two-liquid system to achieve the direct growth of well-oriented organic crystals on an active channel region in an organic field-effect transistor (OFET) with high-performance electrical properties, as a result of the proper orientation of molecules in the crystals, the absence of grain boundaries, and low trap densities.

2. Description of the Related Art

Research and development in manufacturing field-effect transistors using organic semiconductors as an active channel layer are being performed, because organic field-effect transistors (OFETs) can be simply and inexpensively manufactured and flexible electronic devices can be manufactured using OFETs (Amanda R. Murphy, et al., *Chem. Rev.* 2007, 1066). In an attempt to gain a fundamental and rigorous understanding of the charge transport characteristics and electrical properties of crystalline OFETs at a microscopic or molecular level, and to develop printing methods for cost-effective and mass-producible electronic devices, considerable effort has been made in the study of organic crystals composed of π-conjugated organic molecules (J. A. Rogers, et al., *Science* 2004, 303, 1644).

Generally, compared with networked organic thin-film field-effect transistors (OTFTs), crystalline organic transistors exhibit better electrical properties, such as higher carrier mobility, as a result of the proper orientation of molecules in the crystal, the absence of grain boundaries, and the low trap densities.

However, growing crystals in the highest-mobility direction on an active channel region in OFETs is technically a significant challenge (Z. Bao, et al., *Nature* 2006, 444, 913). Moreover, in solution-based processes, which are generally favorable for isotropic growth of crystals, it is very difficult to grow a well-oriented organic single crystal in an active channel region in transistors (T. Yamao, et al., *Chem. Mater.* 2007 19, 3748).

Thus, a practical solution-based approach to place crystalline organic materials in an active channel region in organic transistors requires the development of a direct crystal growth method.

Research has been focused on organic semiconductor materials that can be processed in solution to create printed electronic devices, such as flexible displays, electronic signages, photovoltaic panels, membrane keyboards, radio-frequency identification tags (RFIDs), electronic sensors, integrated electronic circuits, and the like. Printing methods are considered to be cost-effective and suitable for mass production. Functional structures can be made through sequential ejections of constituent materials in a process similar to ink-jet printing. Ink-jet printing methods are the natural and appropriate choice for the production of low-cost printed electronic devices such as OFETs (T. Sekitani, et al., *Proc. Natl. Acad. Sci. U.S.A.* 2008. 105, 4976).

However, conventional inkjet printing techniques are unable to provide well-oriented organic crystals for an active channel region in OFETs. As a result, carrier mobility is not satisfactory, and thus the OFETs may not be suitable for practical applications. Thus, it would be useful to adapt or improve the conventional inkjet printing method to realize high-performance crystalline organic transistors having well-oriented dozens of organic crystals. The present inventors recognized such drawbacks of the conventional art, which resulted in the conception and development of the various inventive features described hereafter.

SUMMARY OF THE INVENTION

One or more embodiments include a method of manufacturing the OFETs with well-oriented dozens of organic crystals as an active layer by using a micropipette or similar device. This process is similar to inkjet printing, but has various improvements and enhancements thereto.

The embodiments solve the above-mentioned problems of conventional inkjet printing with an enhanced drop-cast printing process.

The direct growth of organic crystals in an active channel can be achieved by employing a modified drop-cast method and hydrophilic-hydrophobic interaction between at least two different liquids.

Well-oriented organic crystals can be formed in the channel region in OFETs. The method basically consists of the two steps: the first step is to place a drop(s) of first liquid on a central region of the drain electrode, and the second step is to place a drop(s) of second liquid containing dissolved organic semiconductor species (or material) onto the first liquid droplet.

The evaporation rate of the first liquid is lower than that of the second liquid, and the second liquid is immiscible with the first liquid due to their different polarities.

The embodiments may also include: a substrate, a gate electrode, source and drain electrodes, an insulator (or dielectric) layer which insulates the gate electrode from the source and drain electrodes, an organic semiconductor layer which is insulated from the gate electrode, and dozens of organic crystals are formed on the active channel layer.

Organic semiconductors can be chosen such that they have high solubility in most organic solvents and that they are well-ordered in the solid state.

When dropped onto the first liquid, the second liquid containing the organic semiconductors starts to spread out from the top center surface of the first liquid droplet to the lower bottom periphery of the first liquid droplet. As the second liquid starts to evaporate from its circumference, the crystallization of organic semiconductors takes place at the outermost periphery of the area covered by the second liquid. Owing to the presence of the first liquid droplet during the evaporation of the second solution, the crystallization proceeds isothermally. Thus, it is possible to grow well-oriented organic crystals directly on an active channel region for transistors or other components.

Compared with OFETs fabricated by conventional inkjet printing method, crystalline organic transistors fabricated by the enhanced drop-cast printing method exhibits better electrical properties.

BRIEF DESCRIPTION OF THE DRAWINGS

FIG. 10 shows a Table 1, which is the overview of the electrical properties of two bottom-contact OFETs fabricated by the inventive drop-cast printing method.

DETAILED DESCRIPTION OF THE INVENTION

The detailed description of certain exemplary embodiments will be given. Examples are illustrated in the accompanying Figures and Tables. However, the inventive concepts described herein may be embodied in many different forms and should not be limited to the embodiments set forth herein.

Figure 1:
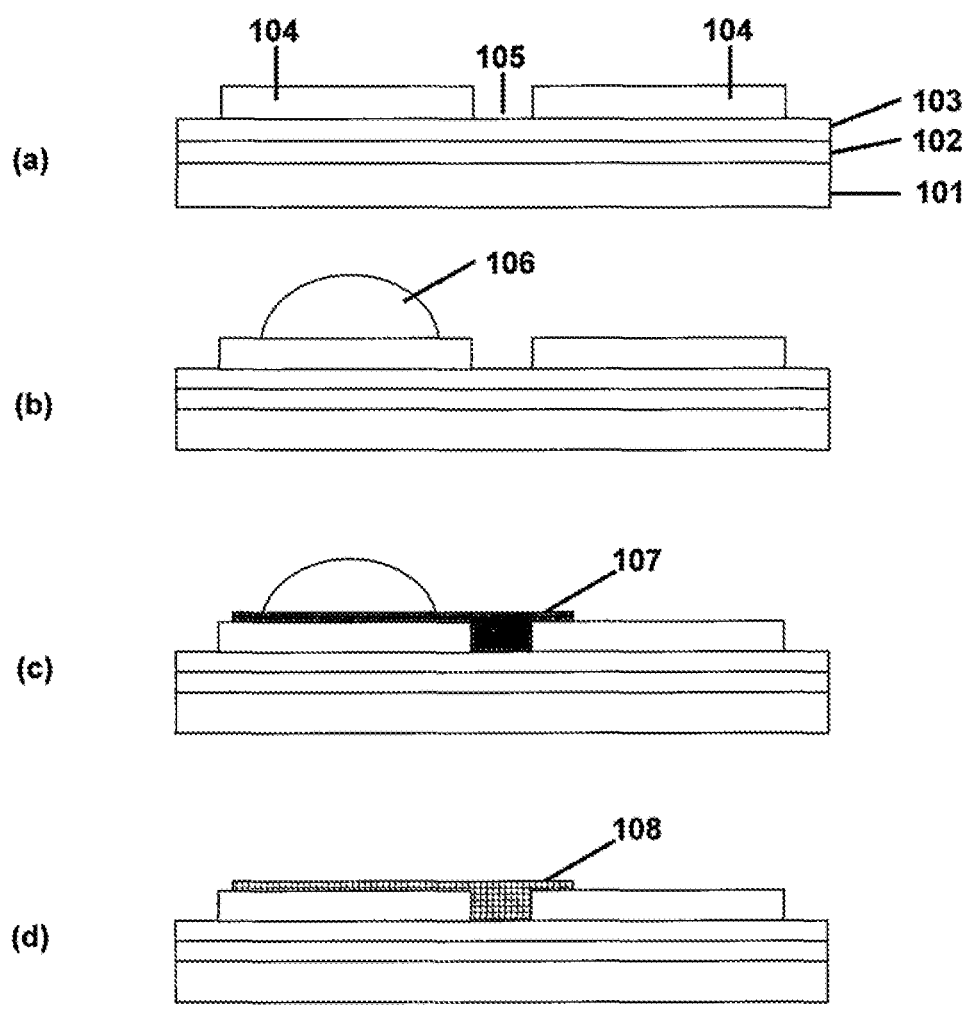
FIG. 1 shows cross-sectional views of the procedure for the direct growth of well-oriented organic semiconductors crystals on an active channel region in bottom-contact OFETs.

FIG. 1 shows cross-sectional views of an exemplary manufacturing process of well-oriented organic semiconductors crystals on an active channel region in bottom-contact OFETs. The OFETs may include the following components: a substrate 101, a gate electrode 102, a gate dielectric (insulator) material 103, source and drain electrodes 104, a channel region 105, a first liquid 106, a second liquid containing dissolved organic semiconductors 107, and organic crystals 108.

The source and drain electrodes can have bottom-contact geometry 104 (FIG. 1a). The method used for the direct growth of the well-oriented organic crystals 108 on the channel region 105 in OFETs basically comprises two steps: the first step is to place the first liquid (droplet) 106 on the drain 104 (FIG. 1b), the second step is to place the second liquid (containing organic semiconductors) 107 on the top of the first liquid (droplet) 106. Because the second liquid 107 is immiscible with the first liquid 106, the second liquid 107 spreads out immediately from the top center surface of the first liquid (droplet) 106 down onto the periphery of the first liquid droplet 106 (FIG. 1c). Namely, the second liquid 107 is dropped onto the first liquid droplet 106, flows downward and gathers at a base region around the periphery of the first liquid droplet 106 due to the hydrophilic-hydrophobic interaction between the first and second liquids. Here, it can be understood that if the second liquid 107 is dropped exactly onto the central region of the first liquid droplet 106 (by means of using the same micropipette or some other device with multiple nozzles, pipettes, depositing points, etc. that allows such precise liquid dropping or casting procedure), the second liquid 107 should flow downward equally and uniformly due to the repulsion and surface energy differences between the first and second liquids. As a result, the second liquid 107 accumulates evenly around the base or periphery of the first liquid droplet 106. Also, it can be understood that the amount of second liquid 107 being dropped onto the first liquid droplet 106 can be controlled such that effective accumulation of the second liquid 107 can be achieved even when margins of error are taken into account. As the second liquid 107 starts to evaporate from its outer circumference, the crystallization of organic semiconductors takes place at the outermost periphery of the area covered by the second liquid 107. The crystallization of organic semiconductors continues until the second liquid 107 has been almost or completely evaporated (FIG. 1d). Owing to the presence of the first liquid (droplet) 106 during the solvent evaporation of the second liquid (containing dissolved organic semiconductors) 107, the crystallization proceeds in an isothermal manner. Here, it can be understood that the evaporation procedure time can be specifically controlled (i.e. lengthened or shortened) based upon the desired time it takes for the proper crystal molecule alignment to take place during crystallization. Thus, depending upon the particular chemical constitution of the second liquid 107, the necessary crystallization time (related to evaporation) may need to be adjusted appropriately. Such time may be adjusted by various chemical and/or physical means, such as use of different solvents, adjustment of environmental conditions that cause evaporation, and the like.

In this method, organic semiconductors can be chosen such that they have high solubility in most organic solvents and that they are well-ordered in the solid state. Any deposition method that is capable of placing the first liquid droplet 106 and then the second liquid 107 thereon can be used. It can be understood that various types of liquids, solutions, viscous materials, etc. can be employed for the first and second liquids. Also, various factors and conditions may influence the drop-cast procedure or other liquid dropping technique. The liquid amount, liquid viscosity, liquid evaporation rates, drop height, drop angle, drop atmosphere, drop splash, etc. are some factors that are considered. The characteristics of the dropping or casting device, such as a pipette, may also effect how the liquids can be dropped. Also, the desired depth (or height), width, configuration and other dimensions of the channel region to be formed between the source and drain electrodes need to be considered when determining the amount and how the first and second liquids are to be dropped (or cast). The first and second liquids may be dropped from the same pipette or from different pipettes that are positioned such that the second liquid is dropped from precisely the same position (or from the same effective position) as that for the first liquid or from some other appropriate position that results in the desired crystallization to be achieved. Depending upon the type of crystallization that should be achieved, one or more of the above-mentioned factors and/or conditions may be varied or adjusted accordingly.

First Embodiment

A number of solution-processable organic semiconductor materials have been synthesized, characterized, and fabricated as organic transistors (S. Allard, *Angew. Chem. Int. Ed.* 2008, 47, 4070).

Among them, a TIPS pentacene has been widely used to fabricate high-performance OTFTs, as it has high solubility in most organic solvents and has a high degree of π-overlap that contribute to the high charge-carrier mobility of OFETs (J. E. Anthony, *Angew. Chem. Int. Ed.* 2008, 47, 452). In the present exemplary embodiments, to form well-oriented TIPS pentacene crystals on an active channel region in bottom-contact OFETs, the evaporation rates of xylene solvent were appropriately controlled through its interaction with polar $H_2O$.

Figure 2:
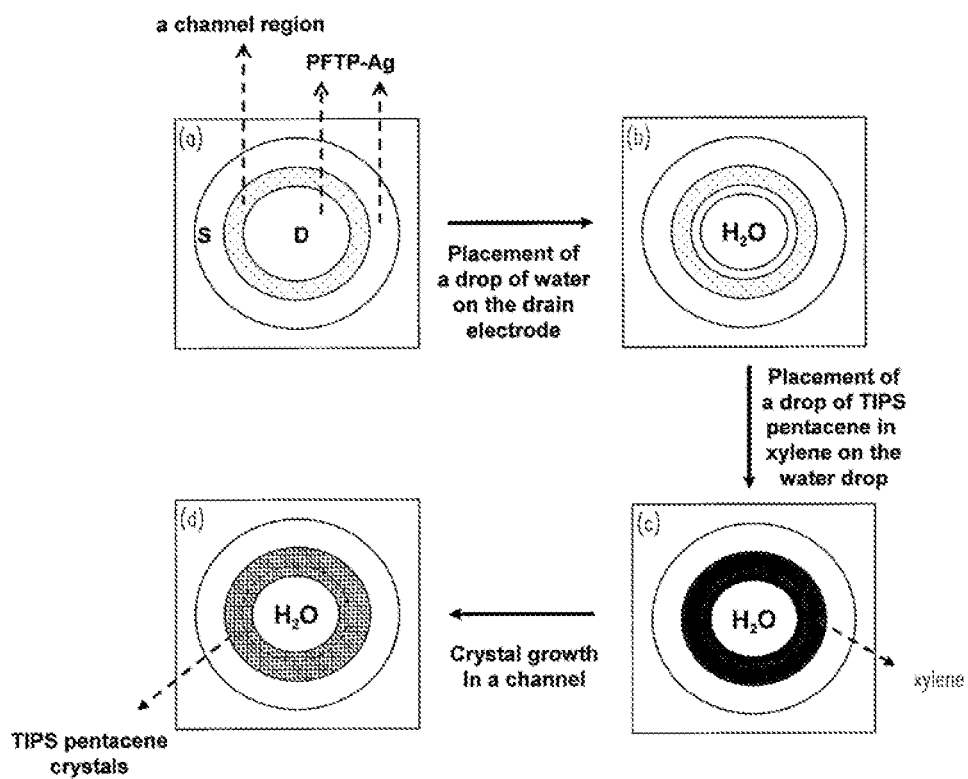
FIG. 2 shows the top views of the procedure for the direct growth of well-oriented organic semiconductors crystals on an active channel region in bottom-contact OFETs.

FIG. 2 is a schematic illustration of an example of the present method using a two-liquid system. It shows the direct growth of well-oriented TIPS pentacene crystals on an active channel region in bottom-contact OFETs. Dozens of TIPS pentacene crystals are grown directly on the circular active region of the OFETs along the radial direction. The transistors with TIPS pentacene crystals as active channel materials can thus be fabricated in the bottom-contact geometry.

TIPS pentacene was synthesized as described in the paper by J. E. Anthony et al. (J. E. Anthony, et al., *Org. Lett.* 2002, 4, 15). A heavily doped Si wafer was used as the gate electrode and a hexamethyldisilazane (HMDS)-treated $SiO_2$ layer (thickness, ~300 nm) was used as the gate dielectric. A thermally evaporated layer of Ag (40 nm) was used as the source/drain electrodes, which was patterned using a photolithography and a lift-off method. The resulting bottom-contact electrodes comprised a circular-shaped drain electrode located at the center region and an annular-shaped source electrode at the periphery region thereof (FIG. 2a). The channel lengths, L (the length between the source and drain electrodes along the radial direction) were about 200 μm and the widths (circumference of an inner circle of the annular source electrode) were about 6280 μm. The active region for such transistors can be defined as an annular-shaped strip (or ring-like region) located between the source and drain electrodes. Self-assembled monolayers (SAMs) were formed on the patterned Ag electrodes by immersing them in a 1 mM ethanolic solution of pentafluorothiophenol (PFTP; Aldrich) for about 1 hour. The chemically modified Ag electrodes were then removed from the solution, rinsed with ethanol several times, and then dried with $N_2$ gas; and the resulting PFTP-Ag electrodes facilitated efficient hole injection to the TIPS pentacene in the active circular channel (*Appl. Phys. Lett.* 2008, 92, 143311). To form TIPS pentacene crystals on the active channel region, a drop(s) of deionized water (~0.05 μl) was placed onto the circular drain region located at or near the center thereof (FIG. 2b) and then a drop(s) of o-xylene solution (~0.03 μl) containing TIPS pentacene (0.8 wt %) was placed onto the top of the deionized water droplet using a micropipette or similar device (FIG. 2c). The crystallization of TIPS pentacene proceeded for about 1 minute. The resulting structure was then annealed at around 90° C. for about 10 minutes. Here, it can be clearly understood that the particular amounts for the liquids, solutions, chemical components, etc. and the temperatures and reaction times can be varied depending upon the desired crystallization to be obtained. Due to the presence of the water droplet during the evaporation of the o-xylene solvent, the crystallization proceeded isothermally. Thus, it was possible to grow well-oriented TIPS pentacene crystals directly on an active channel region in a transistor (FIG. 2d). Here, it is contemplated that various shapes other than the simple circles and rings for the source, drain, and channel region shown in FIG. 2 can also be obtained. To achieve such non-circular shaped active regions or channels, the various factors and conditions that influence the drop-cast procedure can be modified. The substrate 101 can be processed such that its surface and/or the various layers provided thereon (102, 103, 104) are deposited in an appropriate manner to achieve different configurations. So called anti-wetting materials or other substances can be used or applied on the substrate or other layers such that the first and second liquid drop procedure employing the hydrophilic-hydrophobic interaction between two different liquids allows crystallization to occur in different shapes and configurations.

Electrical characterization of the transistors was performed at room temperature in air using a Keithley™ 4200-SCS semiconductor analyzer. Field-effect mobility (μ) was estimated in the saturation regime ($V_{DS}=-40\,V$) from the plot of the square-root of the drain current vs. $V_{GS}$ using the following equation:

$$I_{DS,sat} = \frac{WC_i}{2L}\mu(V_{GS} - V_T)^2$$

where $I_{DS}$ is the source-drain (drain-source) saturation current; $C_i$ ($1.1\times10^{-8}$ F) is the capacitance of the $SiO_2$ insulator; W/L is the ratio of the width to the channel length; and $V_{GS}$ and $V_T$ are the gate-source and threshold voltages, respectively.

Figure 3:
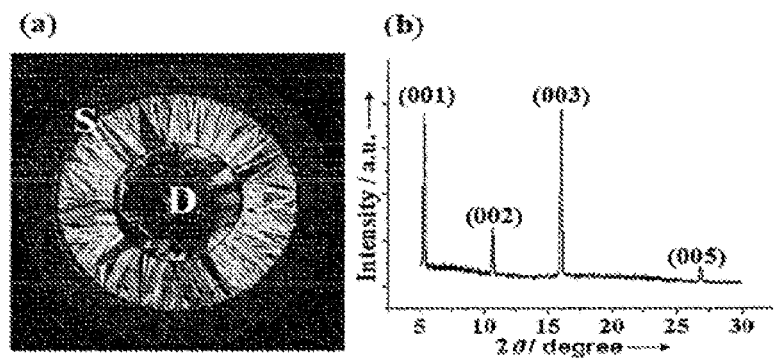
FIG. 3 shows the polarized optical micrograph of the TIPS pentacene crystals transistors and X-ray diffraction (XRD) patterns of the directly grown TIPS pentacene crystals.

FIG. 3 shows the polarized optical micrograph of the TIPS pentacene crystals transistors and the corresponding x-ray diffraction (XRD) patterns of the directly grown TIPS pentacene crystals. The XRD pattern of these TIPS pentacene crystals shows diffraction peaks for the (001) reflection, which indicates that the TIPS pentacene molecules in the crystals have their bulky silyl groups oriented vertically with respect to the substrate.

Figure 4:
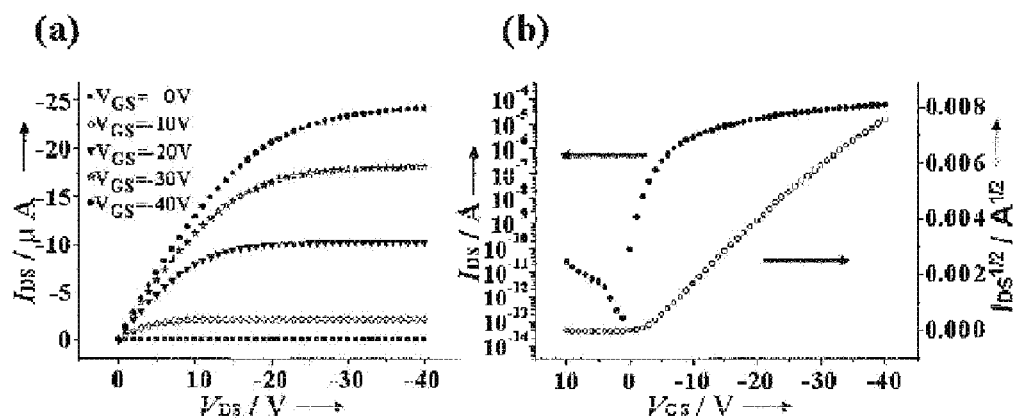
FIG. 4 shows the output (a) and transfer characteristics (b) of the TIPS pentacene crystals transistors.

The output (a) and transfer characteristics (b) of the TIPS pentacene crystal transistors are shown in FIG. 4. The field-effect mobility (μ) was obtained from the slope in the saturation regime ($V_{DS}=-40\,V$) and W/L was defined as the ratio of the circumference of the inner boundary of the source electrode to the radial distance between the source and the drain electrodes. The TIPS pentacene crystals transistors with PFTP-Ag electrodes exhibited a p-type mobility of about 0.30 $cm^2/V\cdot s$ in the saturation region and a current on/off ratio of about $4\times10^8$.

Figure 5:
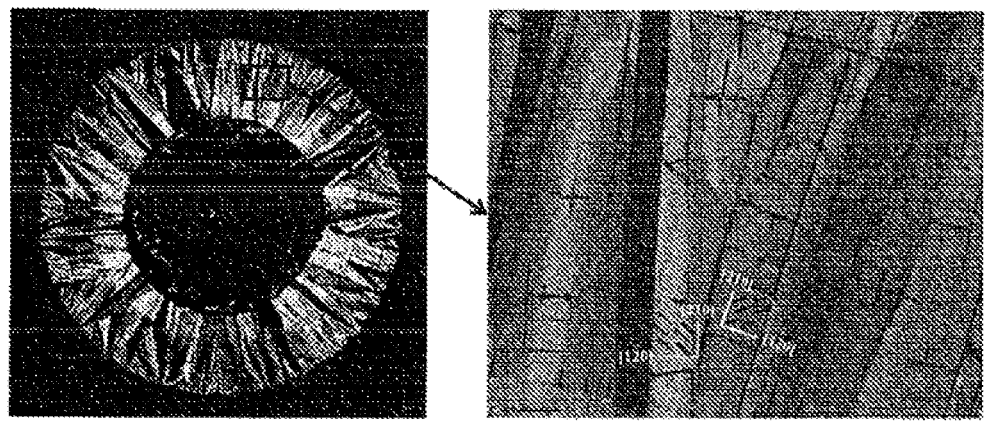
FIG. 5 shows the polarized optical micrograph of TIPS pentane transistors after heated at 160° C. for 15 min and then cooled to room temperature.

FIG. 5 shows the polarized optical micrograph of TIPS pentane transistors after heated at about 160° C. for about 15 minutes and cooled to room temperature. The thermal cracking in the TIPS pentacene crystals revealed that the crystal growth direction was [210], which is the best hole-transport pathway in the TIPS pentacene transistor (J. Chen. et al., *J. Phys. Chem. B.* 2006, 110, 16397).

Figure 6:
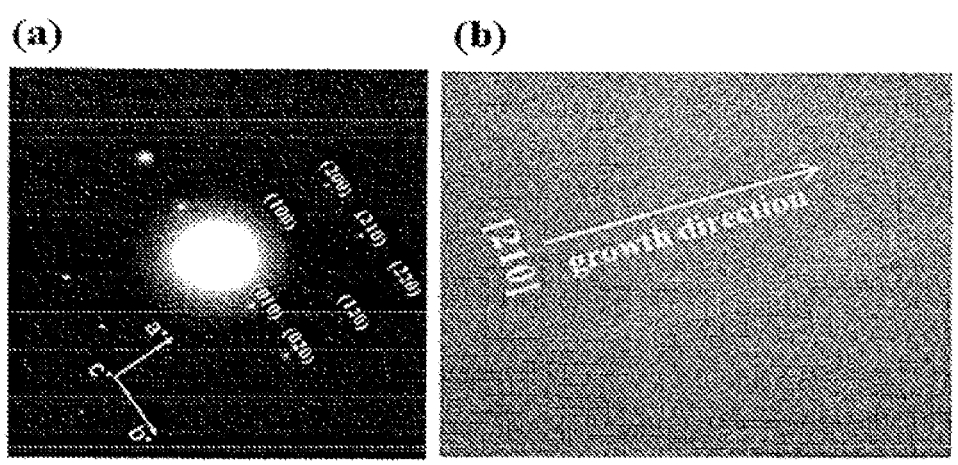
FIG. 6 shows a SAED (selected area electron diffraction) pattern (a), and the corresponding bright-field TEM image of TIPS pentacene crystals (b).

FIG. 6 shows a selected area electron diffraction (SAED) pattern (a), and the corresponding bright-field TEM image of (b) a TIPS-pentacene crystal. These results also indicated that crystal growth direction was [210].

Second Embodiment

Figure 7:
FIG. 7 shows the polarized optical micrograph of the TIPS pentacene transistors fabricated by a conventional drop-cast printing method.

FIG. 7 shows the polarized optical micrograph of the TIPS pentacene transistors fabricated by a conventional drop-casting printing method, whereby bottom-contact electrodes were used and a drop(s) of o-xylene solution (~0.03 μl) containing TIPS pentacenes (0.8 wt %) was placed onto the top of an active channel region using a micropipette. The conventional drop-casting printing method uses a so-called one-liquid system. The resulting structures were then annealed at around 90° C. for about 10 minutes. In contrast to FIG. 3a, it can be seen that uneven morphology was obtained and thus randomly oriented crystal structures were obtained as a result.

Figure 8:
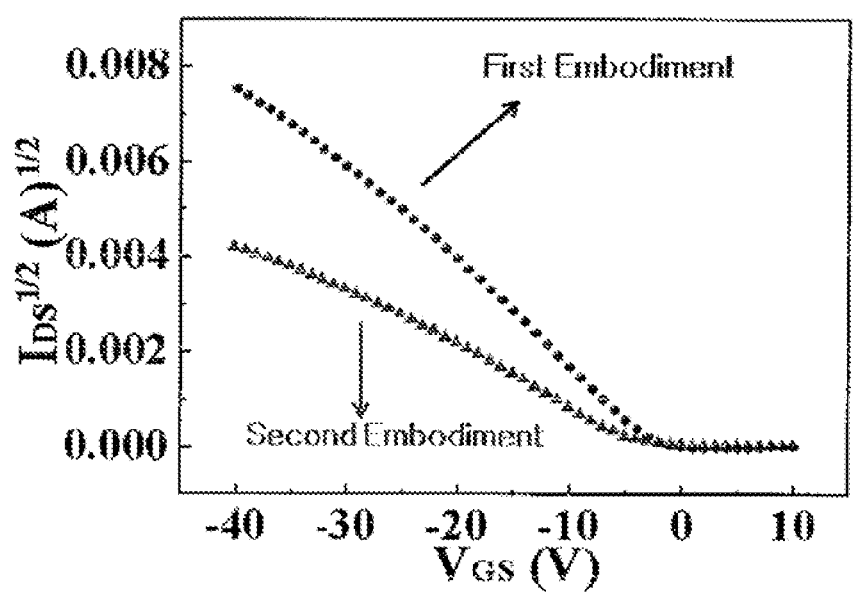
FIG. 8 shows the transfer characteristics of the two OFETs fabricated by a conventional inkjet drop-cast printing method (a one-liquid system) and the inventive inkjet drop-cast printing method (a two-liquid system).

FIG. 8 shows the transfer characteristics of the two OFETs fabricated by a conventional drop-cast printing method (i.e. a one-liquid system) and the inventive drop-cast printing method (i.e. a so-called two-liquid system). The OFETs fabricated by the inventive drop-cast printing method exhibited better electrical properties, compared with those fabricated by a conventional drop-cast printing method.

The electrical properties of bottom-contact OFETs fabricated by a conventional drop-cast printing method (one-liquid system) and the inventive drop-cast printing method (a two-liquid system) are summarized in Table I.

According to FIG. 8 and Table I, the OFETs fabricated by the inventive drop-cast printing method (a two-liquid system), namely, the OFETs with crystalline organic materials formed at an active channel exhibit better electrical properties as a result of the proper orientation of molecules in the crystal, the absence of grain boundaries, and low trap densities.

Third Embodiment

Figure 9:
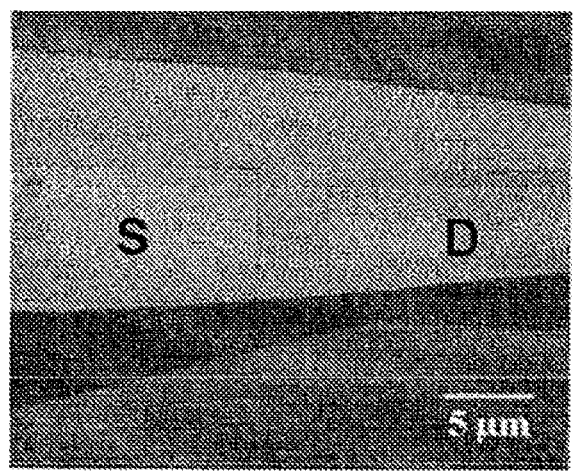
FIG. 9 shows the polarized optical micrograph of a TIPS pentacene crystal transistor with square-shaped source and drain electrodes.

FIG. 9 is a polarized optical micrograph of a crystalline TIPS pentacene transistor with square-shaped source and drain electrodes manufactured by the inventive drop-cast method. The third embodiment differs from the first embodiment in the geometric shape of the source and drain electrodes. The TIPS pentacene crystals were grown directly on a square-shaped (or rectangular) active region of the OFETs. The various factors and conditions of the inventive drop-cast procedure or other liquid dropping technique can be modified according to the liquid amount, liquid viscosity, liquid evaporation rates, drop height, drop angle, drop atmosphere, drop splash, etc. Also, the characteristics of the dropping or casting device, such as a pipette system can be adjusted, and the substrate 101 can be processed such that its surface and/or the various layers provided thereon (102, 103, 104) are deposited in an appropriate manner to achieve different configurations such that the desired crystallization growth in these square-shaped, rectangular-shaped, or other geometric shapes of active regions (channels) can be obtained.

The inventive concepts described herein can be expressed as a method of forming an active channel region, the method comprising the steps of: placing at least one droplet of a first liquid onto a first electrode region on an insulating layer deposited on the substrate that has a second electrode region formed around the first electrode region; placing at least one droplet of a second liquid containing dissolved organic semiconductors onto the droplet of the first liquid placed on the first electrode region on the insulating layer on the substrate; and evaporating the first and second liquids until crystalline organic materials are formed in an active channel region defined at a periphery region between the first electrode region and the second electrode region.

The second liquid may be immiscible with the first liquid. The second liquid spreads out immediately and flows down from a top central surface of the first liquid droplet onto a bottom periphery of the first liquid droplet. As the second liquid starts to evaporate from an outermost circumference thereof, crystallization of organic semiconductors takes place at an outermost periphery of a region covered by the second liquid to result in a direct growth of well-oriented dozens of π-conjugated organic crystals. The first liquid droplet may stay steady (or constant) until the second liquid completely evaporates. The first liquid droplet may completely evaporate after the second solution completely evaporates. The crystallization of organic semiconductors may continue to take place until the second solution completely evaporates. The first electrode region can be a circular drain electrode on an insulating layer formed on the substrate, the second electrode region can be an annular source electrode around a periphery of the circular drain electrode, and a gate electrode can be located beneath a gate dielectric material and under the circular drain electrode and the annular source electrode. The circular drain electrode, the annular source electrode, and the gate electrode may form an organic field-effect transistor (OFET) that is fabricated by using bottom-contact geometry and the active channel region is formed between the circular drain electrode and the annular source electrode. The substrate may be selected from a group comprising glass, paper, amorphous silicon, and plastic; the gate electrode is selected from a group comprising gold (Au), silver (Ag), chromium (Cr), aluminum (Al), titanium (Ti), nickel (Ni), molybdenum (Mo), tungsten (W), indium tin oxide (ITO), indium zinc oxide (IZO), poly-Si, carbon nanotubes (CNTs), and graphenes; if both the source and drain electrodes are p-type electrodes, the source and drain electrodes may be selected from a group comprising high work function electrodes using gold (Au), platinum (Pt), the palladium (Pd), the iridium (Ir), graphene, CNT, and poly(3,4-ethylenedioxythiophene) poly (styrenesulfonate) (PEDOT:PSS), or chemically modified-Ag, ITO and IZO; and if both the source and drain electrodes are n-type electrodes, the source and drain electrodes may be selected from a group comprising low work function electrodes using Ag, Al, Ti, or chemically modified Ag, ITO, and IZO. An electronic device may be made by using the organic field-effect transistor (OFET) described in the inventive method herein. Also, an organic field-effect transistor (OFET) comprising a substrate, a gate electrode, source and drain electrodes, an insulating layer or gate dielectric material that insulates the gate electrode from the source and drain electrodes, an organic semiconductor active layer that is insulated from the gate electrode and electrically connected to the source and drain electrodes, whereby organic semiconductor crystals are formed in an active channel between the source and drain electrodes according to the inventive method may be made.

Also, the inventive concepts described herein can be expressed as an electronically functional device comprising: a substrate; a gate electrode on the substrate; a gate dielectric material formed over the gate electrode; a first electrode region and a second electrode region formed on the gate dielectric material; and an active channel region formed between the first electrode region and the second electrode region by employing a drop-cast printing technique that applies at least one droplet of a first liquid solution onto the first electrode region, then applies at least one droplet of a second liquid solution containing dissolved organic semiconductor materials onto the first liquid droplet such that the second liquid solution gathers evenly at a base of the first liquid solution droplet due to hydrophobic-hydrophilic interactions between the first and second liquid solutions, and forms organic crystals for the active channel region upon evaporation of at least the second liquid solution, whereby the organic crystals formed as a result of crystallization after the drop-cast printing technique have an appropriate molecular orientation in a highest mobility direction, have minimal grain boundaries and have relatively low trap densities At least one of the first electrode region, the second electrode region, and the active channel region may have a circular shape or non-circular shape when viewed orthogonally from a planar surface of the substrate. An amount of the first and second liquid solutions used in the drop-cast printing technique and conditions for drop-cast procedures may depend upon particular characteristics of the active channel region to be formed. The conditions for drop-cast procedures may be related to at least one of droplet amount, liquid viscosity, liquid evaporation rates, drop height, drop angle, drop atmosphere, and drop splash, while the characteristics of the active channel region may be related to at least one of depth, width, height, configuration, and other physical dimensions thereof. The droplet of the first liquid solution comprises deionized water and the droplet of the second liquid solution comprises an o-xylene solution containing TIPS pentacenes or organic semiconductor materials. The crystallization proceeds in an isothermal manner during solvent evaporation of the second liquid solution containing dissolved organic semiconductor materials, with an evaporation rate of xylene solvent being appropriately controlled through interaction with polar $H_2O$. The substrate, the gate electrode layer, the insulating layer or gate dielectric material, the first and second electrode regions, and the active channel region form an organic field-effect transistor used in fabrication of low-cost and mass-producible printable electronic devices for applications in at least one of flexible displays, electronic signages, photovoltaic panels, membrane keyboards, radio frequency identification tags (RFIDs), electronic sensors, and integrated electronic circuits.

While the inventive features herein have been particularly shown and described with reference to certain exemplary embodiments, it will be understood that those skilled in the art that various changes in form and detail may be made therein without departing from the scope defined by the appended claims.

What is claimed is:

1. An electronically functional device comprising:
   a substrate;
   a gate electrode on the substrate;
   a gate dielectric material formed over the gate electrode;
   a first electrode region and a second electrode region formed on the gate dielectric material; and
   an active channel region formed between the first electrode region and the second electrode region as a result of a drop-cast printing technique that applies at least one droplet of a first liquid onto the first electrode region, then applies at least one droplet of a second liquid containing dissolved organic semiconductor materials onto the first liquid such that the second liquid accumulates at a base of the first liquid due to hydrophobic-hydrophilic interactions between the first and second liquids, and organic crystals for the active channel region are formed upon evaporation of at least the second liquid,
   whereby the organic crystals formed as a result of crystallization after the drop-cast printing technique have a particular molecular orientation in a highest mobility direction, have relatively minimal grain boundaries and have relatively low trap densities,
   wherein the organic crystals are at least partially disposed on the first electrode region and radially around an annular central portion of the first electrode region that is not covered by the organic crystals;
   wherein the first electrode region is a drain electrode on the substrate, the second electrode region is a source electrode around a periphery of the drain electrode, and the gate electrode is located beneath the gate dielectric material and under the drain electrode and the source electrode,
   wherein the drain electrode, the source electrode, and the gate electrode form an organic field-effect transistor (OFET) and the active channel region is formed between the drain electrode and the source electrode,
   wherein an amount of the first and second liquids used in the drop-cast printing technique and conditions for drop-cast procedures depend upon particular characteristics of the active channel region to be formed, and
   wherein the conditions for drop-cast procedures are related to at least one of droplet amount, liquid viscosity, liquid evaporation rates, drop height, drop angle, drop atmosphere, and drop splash, and the characteristics of the active channel region are related to at least one of depth, width, height, configuration, and other physical dimensions thereof.

2. The device of claim 1, wherein at least one of the first electrode region, the second electrode region, and the active channel region has a circular shape when viewed orthogonally with respect to a planar surface of the substrate.

3. The device of claim 1, wherein at least one of the first electrode region, the second electrode region, and the active channel region has a non-circular shape when viewed orthogonally with respect to a planar surface of the substrate.

4. The device of claim 1, wherein the first liquid comprises deionized water and the second liquid comprises an o-xylene solution containing TIPS pentacenes or organic semiconductor materials.

5. The device of claim 4, wherein the crystallization proceeds in an isothermal manner during solvent evaporation of the second liquid containing dissolved organic semiconductor materials, with an evaporation rate of xylene solvent being appropriately controlled through interaction with polar $H_2O$.

6. The device of claim 1, wherein the substrate, the gate electrode layer, the gate dielectric material, the first and second electrode regions, and the active channel region are part of an organic field-effect transistor used in fabrication of printable electronic devices.

7. The device of claim 6, wherein the printable electronic devices comprise at least one of flexible displays, electronic signages, photovoltaic panels, membrane keyboards, radio frequency identification (RFID) tags, electronic sensors, and integrated electronic circuits.

8. The device of claim 1, wherein the second liquid is immiscible with the first liquid.

9. The device of claim 1, wherein the second liquid spreads out and flows down from a top central surface of the at least one droplet of the first liquid onto a bottom periphery thereof.

10. The device of claim 9, wherein as the second liquid starts to evaporate from an outermost circumference thereof such that crystallization of organic semiconductors takes place at an outermost periphery of a region covered by the second liquid to result in a direct growth of relatively well-oriented dozens of π-conjugated organic crystals.

11. The device of claim 10, wherein the crystallization of organic semiconductors continues to take place until the second liquid completely evaporates.

12. The device of claim 9, wherein the first liquid stays relatively steady or constant until the second liquid completely evaporates.

13. The device of claim 9, wherein the first liquid completely evaporates after the second liquid completely evaporates.

14. The device of claim 1, wherein the organic crystals in the active channel are triisopropylsilyl (TIPS) pentacene crystals.

15. The device of claim 1, wherein the organic crystals in the active channel are relatively well-oriented dozens of π-conjugated organic crystals.

16. The device of claim 1, wherein the substrate is selected from a group comprising glass, paper, amorphous silicon, and plastic; and the gate electrode is selected from a group comprising gold (Au), silver (Ag), chromium (Cr), aluminum (Al), titanium (Ti), nickel (Ni), molybdenum (Mo), tungsten (W), indium tin oxide (ITO), indium zinc oxide (IZO), poly-Si, carbon nanotubes (CNTs), and graphenes.

17. The device of claim 1, wherein if both the source and drain electrodes are p-type electrodes, the source and drain electrodes are selected from a group comprising relatively high work function electrodes using gold (Au), platinum (Pt), palladium (Pd), iridium (Ir), graphene, CNT, and poly(3,4-ethylenedioxythiophene) poly(styrenesulfonate) (PEDOT:PSS), or chemically modified-Ag, ITO and IZO.

18. The device of claim 1, wherein if both the source and drain electrodes are n-type electrodes, the source and drain electrodes are selected from a group comprising relatively low work function electrodes using Ag, Al, Ti, or chemically modified Ag, ITO, and IZO.

19. An electronically functional device comprising:
a substrate; and
a component having a gate electrode on the substrate, a gate dielectric material formed over the gate electrode, a first electrode region and a second electrode region formed on the gate dielectric material, and an active channel region formed between the first electrode region and the second electrode region,
said active channel region containing organic crystals having a particular molecular orientation in a highest mobility direction, having relatively minimal grain boundaries and having relatively low trap densities, wherein the organic crystals in the active channel are triisopropylsilyl (TIPS) pentacene crystals,
said active channel region formed by an ink-jet printing method that drops a first solution onto the first electrode region, then drops a second solution having organic semiconductor materials onto the first solution such that the second solution accumulates at a base of the first solution due to hydrophobic-hydrophilic interactions between the first and second solutions, and organic crystals for the active channel region are formed upon crystallization of at least the second solution,
wherein the organic crystals are at least partially disposed on the first electrode region and radially around an annular central portion of the first electrode region that is not covered by the organic crystals;
wherein the first electrode region is a circular drain electrode on the substrate, the second electrode region is an annular source electrode around a periphery of the circular drain electrode, and a gate electrode is located beneath a gate dielectric material and under the circular drain electrode and the annular source electrode,
wherein the circular drain electrode, the annular source electrode, and the gate electrode form an organic field-effect transistor (OFET) that is fabricated by using bottom-contact geometry and the active channel region is formed between the circular drain electrode and the annular source electrode,
wherein at least one of the substrate and the component undergo surface processing through use of anti-wetting materials being applied in a particular manner to achieve different configurations for the component,
wherein the substrate is selected from a group comprising glass, paper, amorphous silicon, and plastic; and the gate electrode is selected from a group comprising gold (Au), silver (Ag), chromium (Cr), aluminum (Al), titanium (Ti), nickel (Ni), molybdenum (Mo), tungsten (W), indium tin oxide (ITO), indium zinc oxide (IZO), poly-Si, carbon nanotubes (CNTs), and graphenes, and
wherein if both the source and drain electrodes are p-type electrodes, the source and drain electrodes are selected from a group comprising relatively high work function electrodes using gold (Au), platinum (Pt), palladium (Pd), iridium (Ir), graphene, CNT, and poly(3,4-ethylenedioxythiophene) poly(styrenesulfonate) (PEDOT:PSS), or chemically modified Ag, ITO and IZO.

20. The device of claim 19, wherein if both the source and drain electrodes are n-type electrodes, the source and drain electrodes are selected from a group comprising relatively low work function electrodes using Ag, Al, Ti, or chemically modified Ag, ITO, and IZO.

* * * * *